United States Patent [19]

Shipley, Jr.

[11] Patent Number: 5,334,488

[45] Date of Patent: Aug. 2, 1994

[54] METHOD FOR MANUFACTURE OF MULTILAYER CIRCUIT BOARD

[75] Inventor: Charles R. Shipley, Jr., Newton, Mass.

[73] Assignee: Shipley Company Inc., Marlborough, Mass.

[21] Appl. No.: 59,912

[22] Filed: May 10, 1993

Related U.S. Application Data

[63] Continuation of Ser. No. 462,607, Jan. 9, 1990, Pat. No. 5,246,817, which is a continuation-in-part of Ser. No. 54,102, May 20, 1987, Pat. No. 4,902,610, which is a continuation of Ser. No. 761,843, Aug. 2, 1985, abandoned.

[51] Int. Cl.$^5$ .............................................. G03G 5/16
[52] U.S. Cl. .................................... 430/315; 430/312; 430/319
[58] Field of Search ............... 430/315, 311, 313, 319; 427/96, 98

[56] References Cited

U.S. PATENT DOCUMENTS

| | | | |
|---|---|---|---|
| 3,921,777 | 5/1990 | Frankel et al. | 430/314 |
| 3,934,335 | 1/1976 | Nelson | 430/315 |
| 4,469,777 | 9/1984 | O'Neil | 430/313 |
| 4,526,810 | 7/1985 | Nesbitt | 430/315 |
| 4,554,229 | 11/1985 | Small | 430/17 |
| 4,572,764 | 2/1986 | Fan | 430/312 |
| 4,737,446 | 4/1988 | Cohen et al. | 430/313 |
| 4,748,104 | 5/1988 | Ferrier et al. | 430/315 |
| 4,782,007 | 11/1988 | Ferrier | 430/313 |
| 4,795,693 | 1/1989 | Ors et al. | 430/312 |
| 4,897,338 | 1/1990 | Spicciate et al. | 430/314 |

Primary Examiner—Steve Rosasco
Attorney, Agent, or Firm—Robert L. Goldberg

[57] ABSTRACT

The invention is for the formation of multilayer circuit boards where layers are formed sequentially using selective plating techniques and imaging of dielectric materials to achieve fine line resolution and interconnections between circuits. The invention permits the sequential formation of multilayers of higher density using imaging techniques.

9 Claims, 5 Drawing Sheets

METHOD FOR MANUFACTURE OF MULTILAYER CIRCUIT BOARD

CROSS REFERENCE TO RELATED APPLICATIONS

This is a continuation of copending application(s) Ser. No. 07/462,607 filed on Jan. 9, 1990 now U.S. Pat. No. 5,246,817 which application is a continuation-in-part of U.S. patent application Ser. No. 07/054,102, filed May 20, 1987 now U.S. Pat. No. 4,902,610 which latter application is a continuation of U.S. patent application Ser. No. 06/761,843, filed Aug. 2, 1985 now abandoned.

BACKGROUND OF THE INVENTION

1. Introduction

This invention relates to methods for the manufacture of multilayer circuit boards and to the boards produced thereby. More particularly, this invention relates to methods for making multilayer circuit boards by sequential formation of layers having signal layers separated from each other by interconnect layers.

2. Description of the Prior Art

Multilayer circuits enable formation of multiple circuits in minimal volume. They typically comprise a stack of layers with layers of signal lines (conductors) separated from each other by dielectric layers having plated holes known as "buried vias" providing electrical interconnections between the layers.

Current processes for fabricating multilayer boards are extensions of methods used for fabricating double sided boards. The method comprises fabrication of separate innerlayers having circuit patterns disposed over their surface. A photosensitive material is coated over the copper surfaces of a copper clad innerlayer material, imaged, developed and etched to form a conductor pattern in the copper cladding protected by the photosensitive coating. After etching, the photosensitive coating is stripped from the copper leaving the circuit pattern on the surface of the base material. Following formation of the innerlayers, a multilayer stack is formed by preparing a lay up of innerlayers, ground plane layers, power plane layers, etc., typically separated from each other by a dielectric prepreg (a layer consisting of glass cloth impregnated with partially cured material, typically a B-stage epoxy resin). The outer layers of the stack comprise copper clad glass filled epoxy board material with the copper cladding comprising exterior surfaces of the stack. The stack is laminated to form a monolithic structure using heat and pressure to fully cure the B-stage resin.

Interconnections or through-holes, buried vias and blind hole interconnections are used to connect circuit layers within a multilayer board. The buried vias are plated through holes connecting two sides of an innerlayer. Blind vias typically pass through one surface of the stack and pass into and stop within the stack. Regardless of the form of interconnection, holes are generally drilled at appropriate locations through the stack, catalyzed by contact with a plating catalyst and metallized, typically with electroless copper overplated with electrolytic copper, to provide electrical contact between circuit innerlayers.

The uses, advantages and fabrication techniques for the manufacture of multilayer boards are described by Coombs, Printed Circuits Handbook, McGraw Hill Book Company, New York, 2nd edition, pp. 20-3 to 23-19, 1979, incorporated herein by reference.

Multilayer boards have become increasingly complex. For example, boards for main frame computers may have as many as 36 layers of circuitry, with the complete stack having a thickness of about $\frac{1}{4}$ inch. These boards are typically designed with 4 mil wide signal lines and 12 mil diameter vias for interconnections between signal line layers. For increased densification, it is desired to reduce signal lines to a width of 2 mils or less and vias to a diameter of 2 to 5 mils or less.

In addition to decreasing line width and via diameter, it is desired to avoid manufacturing problems associated with multilayer board fabrication. Current manufacturing methods utilize innerlayer materials comprising glass reinforced resin of about 4 to 5 mils in thickness clad with copper on both surfaces. Since lamination is at a temperature above 150° C., the laminate shrinks during cooling to the extent permitted by the copper cladding. If the copper is etched to form a discontinuous pattern, laminate shrinkage may not be restrained by copper cladding. Consequently, further shrinkage may occur. This shrinkage may have an adverse effect on dimensional stability and layer registration.

The lamination procedure for formation of a multilayer stack includes a lay up of components prior to lamination. Care must be exercised to avoid shifting of innerlayers during lamination. Otherwise, the layers will not be aligned and electrical contact between layers will not be achieved. In addition, during lay up, air is often trapped in spaces adjacent to signal lines because a solid pre-preg is laid over the signal lines that does not fill recesses between signal lines. Care should be taken to evacuate entrapped air. Residual air pockets can cause defects and subsequent problems during use of the multilayer board.

SUMMARY OF THE INVENTION

To better understand the invention, the following definitions have been adopted:

"Dielectric coating" means an organic dielectric coating composition capable of imaging to yield a relief image. If the dielectric coating is to become an integral part of the multilayer board, it will be referred to as a "permanent dielectric coating". The dielectric coating may be applied as a liquid coating composition and dried to a tack free coating or as a dry film. Preferably, the dielectric constant of the coating does not exceed 4.5. Imaging of a dielectric coating may be by laser ablation or by exposure to activating radiation and development in which latter case the dielectric coating is a photoactive dielectric coating.

"Imaged openings" means a relief image of (1) recesses or channels defining a pattern of conductors or (2) openings for interconnections, within a dielectric coating. Imaged openings are subsequently selectively metallized whereby metal is contained within the recesses of the relief image.

The subject invention provides a simplified process for the manufacture of multilayer circuit boards avoiding difficulties described above. The process comprises sequential formation of layers where the multilayer structure has at least two circuit layers with conductive interconnections between circuit layers.

The multilayer circuit is formed over a temporary or permanent carrier that may become an integral part of the multilayer stack. If the carrier is a circuit, the process may comprise formation of a dielectric coating over a circuit with imaged openings defining interconnections. The imaged openings may be obtained by exposure of a photoactive dielectric coating to activating radiation through a mask in an image pattern followed by development to form the imaged openings. Alternatively, imaging may be by laser ablation in which case the dielectric material need not be photoactive. The dielectric coating may be coated with another dielectric coating and similarly processed to provide imaged openings in a conductor where the imaged openings define desired circuit geometry. Metal is selectively deposited within the imaged openings to render the same conductive. The walls of the imaged openings in the dielectric coatings contain metal as it deposits during plating and assures a desired cross sectional shape of the deposit. The process is repeated sequentially to form sequential layers of circuits and interconnections.

The process of the invention is characterized by selective metallization of the imaged openings with the relief image of the dielectric coating without increase in the surface resistivity of an underlying substrate between conductor lines. Selective metal deposition may be performed in conventional manner or by new techniques described in detail below. Many procedures employed for selective metal deposition utilize an electroless metal plating catalyst which is defined for purposes herein as a colloidal dispersion of a metallic species catalytic to electroless plating such as colloidal palladium.

To obtain imaged openings in a dielectric coating, the coating may either be exposed to activating radiation in an image pattern and developed or laser ablated in a pattern to yield the relief image. The resolution of the imaged openings is dependent upon the imaging process and materials used. Photoactive dielectric coatings may be capable of development to yield high resolution relief images including openings that are smaller than the thickness of the coating. By use of such coatings, imaged openings for interconnections and conductors can be of a size equivalent to the resolution capability of the dielectric coating and the method of imaging and may be in any desired shape. Hence, conductors and interconnections can be reduced to 1 mil or less.

DESCRIPTION OF THE PREFERRED EMBODIMENTS

Figure 1:
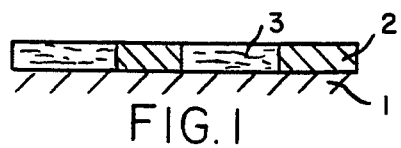
FIGS. 1 to 5 depict the cross section of a multilayer circuit formed over a first circuit layer during various stages of its fabrication in the Embodiment 1 process of the invention and involves the use of a sacrificial coating and a step of plating catalyst removal in a positive mode process.

A multilayer circuit, in accordance with the invention, is formed over a carrier which may become a part of the finished multilayer structure. The carrier may be permanent or temporary. A permanent carrier may comprise, for example, an unclad plastic circuit substrate, a conventional printed circuit board, a molded circuit, a hybrid circuit, ceramic, a housing for an item of electronic equipment, a ground or power plane, etc., with additional layers added by the sequential process of the invention. A further example of a permanent carrier may be an unclad plastic with multiple additive circuits sequentially built into a stack. A temporary carrier may comprise a platen onto which multiple layers are sequentially applied after which the stack is separated from the platen. If the platen is a conductor, at least the first circuit may be formed using electroforming with an imaged dielectric coating formed on the platen and metal electrolytically deposited onto exposed portions of the platen.

The process of the invention uses selective plating techniques. Selective plating can be accomplished using masks applied over catalyzed substrates, sacrificial layers, catalytic dielectric layers, selective application of catalytic poisons, activation of copper surfaces with palladium solutions, etc. Selective metallization techniques, as used in the processes of the subject invention, are illustrated more fully in the following discussion of the drawings.

Alternative embodiments for practice of the invention are set forth below. Materials suitable for practice of the illustrated embodiments are described following a description of the processes. In all embodiments, for purposes of illustration, the starting material is a printed circuit comprising a substrate, conductor lines and a dielectric material separating conductor lines though it should be understood from the discussion above that other substrates may be used. In the embodiments described, imaged openings may be formed by laser ablation or by exposure and development. Some imaging details will be given in the description of the Embodiment 1 process below. Thereafter, in the description of subsequent embodiments, for brevity, little or no discussion of imaging methods will be given. Where permanent dielectric and temporary sacrificial coatings are used, they are of a thickness as is customary in multilayer circuit formation. Preferably, they are approximately one mil in thickness though this thickness may vary from about 0.1 to 2.0 mils as would be understood by those skilled in the art. Coating thickness is based upon the coating method used as well as the solids content of the coating material.

EMBODIMENT 1 (PREFERRED)

Sacrificial Coating with Plating Catalyst Removal in a Positive Mode Process

FIGS. 1 to 5 of the drawings illustrate the formation of a multilayer circuit by a process characterized by use of a sacrificial coating, a positive acting, light sensitive photodielectric coating and a step of catalyst removal.

In FIG. 1, there is shown a first circuit layer comprising substrate 1 having copper conductors 3 separated by a dielectric material 2. The method of making the circuit is not a part of the invention and may comprise conventional additive or subtractive techniques. The substrate may be of any material such as epoxy, polyamide, etc. as is known in the art.

Figure 2:
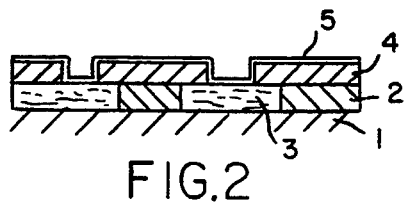

The first step in the process of this embodiment is shown in FIG. 2 and comprises application of a permanent photodielectric coating 4 over the first circuit layer comprising conductors 3 and dielectric material 2. The photodielectric coating is shown with imaged openings in an array of recesses for interconnections. Pattern generation is not shown in the drawings but the pattern may be generated by exposure of the dielectric coating through a mask to a source of activating radiation followed by development to provide the pattern of imaged openings when contacted with a developer or by laser ablation. Following formation of the imaged openings in dielectric coating 4, as shown in FIG. 2, the entire surface of dielectric coating 4 is contacted with an electroless plating catalyst to form catalytic layer 5.

Figure 3:
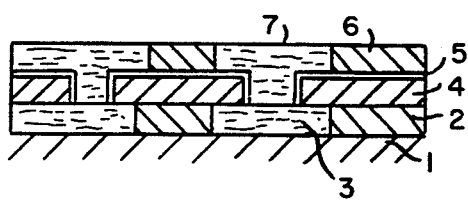

Following formation of catalytic layer 5, as shown in FIG. 3, a sacrificial coating 6 is applied over the catalyzed surface of the dielectric coating 4 having the surface layer of catalyst 5. Though not shown in the Figure, the sacrificial coating is applied as a uniform coating over the entire surface of catalyzed dielectric layer 4 and catalytic layer 5. Following application of the sacrificial coating 6, it is imaged and developed (not shown in the drawings) to provide imaged openings in a desired circuit or conductor pattern. The process of imaging, exposure and development, should remove sacrificial coating material both in those regions where the circuit is to be formed and in those regions where interconnections are located whereby plating catalyst 5 is exposed in the imaged openings in a pattern of interconnections and conductor lines. Following formation of the imaged openings in sacrificial coating layer 6, electroless copper 7 is plated into the imaged openings. Plating is from an electroless plating solution and deposition is catalyzed by contact with exposed plating catalyst 5. Plating preferably continues until a planar surface is formed—i.e., to the full thickness of sacrificial coating layer 6. The sacrificial coating 6 should be of a material able to withstand exposure (contact) with the harsh chemical environment of the plating solution, typically a highly alkaline solution.

Figure 4:
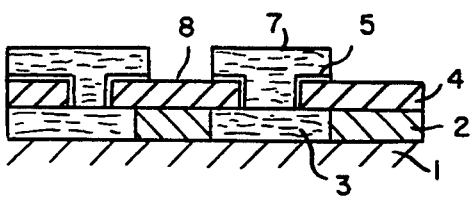

The next step in the process is shown in FIG. 4 of the drawings. The copper deposit is in a pattern of interconnections (pegs) and conductor lines. The sacrificial coating 6 is then removed by contact with a solvent. The removal of the sacrificial coating exposes plating catalyst not coated with the metal deposit. The plating catalyst exposed by removal of the sacrificial coating (not shown) is then stripped from the surface of dielectric coating 4 leaving regions 8 between conductor lines free of catalyst. The purpose of stripping the catalyst layer where exposed is to preserve the surface resistivity properties of the dielectric coating layer 4 by removal of the plating catalyst where bared because plating catalyst layer 5 is more conductive than the dielectric coating material.

Figure 5:
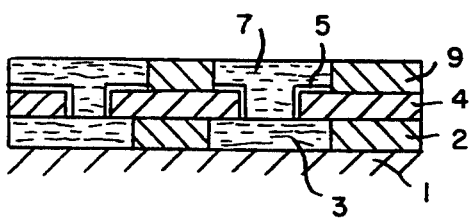

The final step in the process involves optionally filling the spaces between conductor line 7 with a coating of a permanent dielectric material 9 as shown in FIG. 5 of the drawings. This dielectric material is applied by any method known to the art and is intended to partially encapsulate conductor line 7 to form a planar surface and to strengthen the circuit. In this instance, the dielectric coating need not be a photodielectric material.

Following formation of the circuit as described above, the process can be repeated as often as desired.

In the above process, imaged openings in dielectric coating 4 and sacrificial coating 6 can be formed by laser ablation in which case the dielectric material used need not be a photodielectric material. In addition, the process may be reversed. For example, the original substrate shown in FIG. 1 comprising copper conductors 2 and dielectric material 3 may be a conductive ground plane in which case the first layer of dielectric material 4 may be imaged in a conductor pattern and the next layer would be a layer of interconnections.

Generalized comments set forth in connection with the description of Embodiment 1 are also applicable to the additional embodiments described below.

EMBODIMENT 2

Sacrificial Coating with Plating Catalyst Removal in a Negative Mode Process

Figure 6:
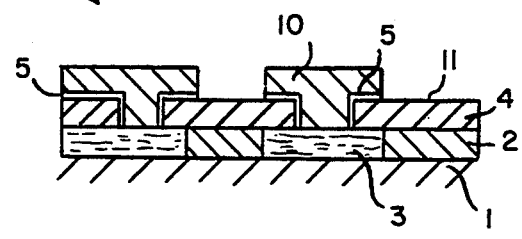
FIGS. 6 to 8, read in conjunction with FIGS. 1 and 2, depict an alternative to the Embodiment 1 process and depict the cross section of a multilayer circuit formed over a first circuit layer during various stages of its fabrication in the Embodiment 2 process of the invention and involves the use of a sacrificial coating and a step of plating catalyst removal in a negative mode process.

The process sequence depicted by FIGS. 1 and 2 of the drawings, as described above, are repeated herein by reference for a complete description of Embodiment 2. Following formation of the structure depicted in FIG. 2 of the drawings, the next steps in the process are illustrated in FIG. 6 where sacrificial coating layer 10 is applied over dielectric coating 4 having surface layer of catalyst 5. In this embodiment, the sacrificial coating layer 10 is formed with imaged openings in a negative pattern of desired circuit lines. Again, imaged openings may be formed by exposure to activating radiation through a mask and development, or by laser ablation. The formation of the imaged openings in sacrificial coating layer 10 exposes portions of catalyst layer 5 that are removed by contact with an etchant to yield catalyst free regions on the surface of dielectric coating 4 between the edges of sacrificial coating layer 10. The remaining portions of sacrificial coating layer 10 protect catalytic layer 5.

Figure 7:
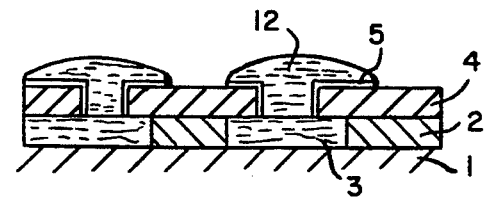

In FIG. 7 of the drawings, the sacrificial coating layer 10 has been removed baring catalyst layer 5 in regions where electroless metal plating is desired (not shown). The next step in the process comprises electroless metal plating over exposed catalytic layer 5 whereby conductive interconnections and circuit lines 12 are formed. In this embodiment, the circuit lines are rounded as they are not contained during plating by an imaged channel. For this reason, this embodiment of the invention is a lesser preferred embodiment.

Figure 8:
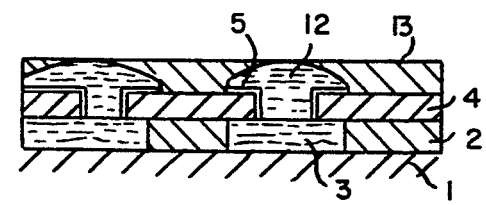

Completion of the circuit is shown in FIG. 8 of the drawings by application of permanent dielectric coating layer 13. The thickness of layer 13 is preferably to the full height of conductors 12. This step is optional, but desired as encapsulation of the conductor lines 12 strengthens the circuit.

The process may be repeated as often as desired to build a multilayer structure comprising successive layers of circuits and interconnections.

EMBODIMENT 3

Use and Removal of Catalyzed Sacrificial Coating Layer

Figure 9:
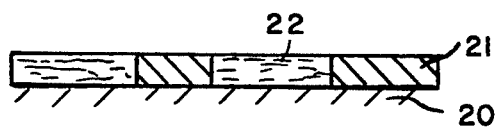
FIGS. 9 to 13 depict the cross section of a multilayer circuit formed over a first circuit layer during various stages of its fabrication in the Embodiment 3 process of the invention and involves the use and removal of a catalyzed sacrificial coating.
Figure 10:
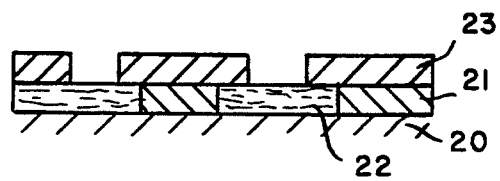
Figure 11:
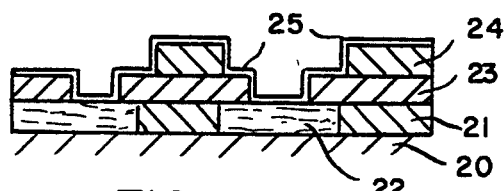

The process of Embodiment 3 of the invention is depicted in FIGS. 9 to 13 of the drawings. FIG. 9 is the same as FIG. 1 but has been renumbered whereby substrate 20 is coated with dielectric coating 21 and copper conductors 22.

Figure 12:
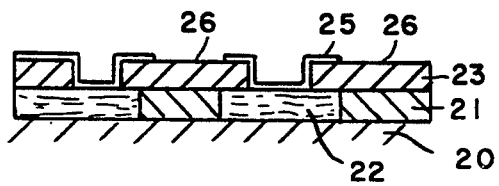

The first step in the process comprises applying dielectric coating 23 over the layer of dielectric coating 21 and copper conductors 22. Dielectric coating 23 is shown as exposed and developed to provide imaged openings defining an array of interconnections. Imaging may be performed in accordance with procedures described above. With reference to FIG. 12, following application of dielectric coating 23, a sacrificial coating layer 24 is applied and provided with imaged openings defining interconnections and conductor lines. The entire surface of sacrificial coating 24 together with exposed portions of dielectric coating 23 and copper conductors 22 is provided with catalytic layer 25.

The next step in the process is illustrated in FIG. 12. Sacrificial coating 24, together with the catalyst layer 25 overlying sacrificial coating 24, is removed by contact with a solvent for sacrificial coating 24 that is not a solvent for dielectric coating 23. Dielectric coating materials and materials for formation of sacrificial coatings having differing solubility properties are known in the art. As shown in FIG. 12, the removal of the catalyzed portions of sacrificial coating 24 bares regions 26 on the surface of dielectric coating 23 free of catalytic layer 25.

Figure 13:
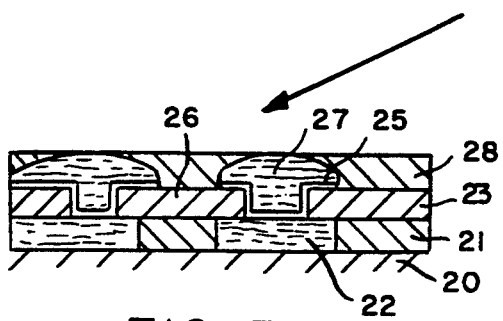

The next steps in the process are depicted in FIG. 13. Electroless copper is plated over catalyzed surfaces 25 to form metallic interconnections and circuit lines 27. Copper does not deposit over catalyst free regions 26. Because electroless copper is not contained by imaged openings or recesses during deposition, the conductor lines are rounded rather than square or rectangular. Following electroless deposition of copper to form interconnects and conductors, the copper may be encapsulated with a permanent dielectric coating layer 28.

EMBODIMENT 4

Replacement of Catalyzed Sacrificial Coating with Permanent Dielectric Coating

Embodiment 4 is similar to Embodiment 3 except that the catalyzed sacrificial coating is replaced with a permanent dielectric coating having imaged openings defining interconnections and conductor lines in order to obtain conductors having a uniform cross section.

In this embodiment, the process steps depicted in FIGS. 9 through 12 of the drawings, as described in the description of Embodiment 3 above, are repeated for Embodiment 4.

Figure 14:
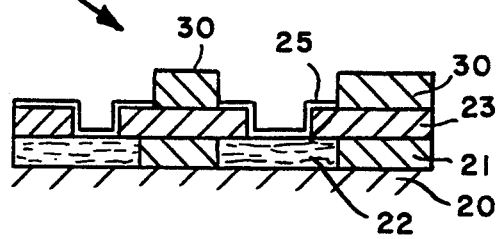
FIGS. 14 and 15 depict the cross section of a multilayer board formed over a first circuit layer during various stages of its fabrication in the Embodiment 4 process of the invention and involves an alternative method for using and replacing a catalyzed sacrificial coating.
Figure 15:
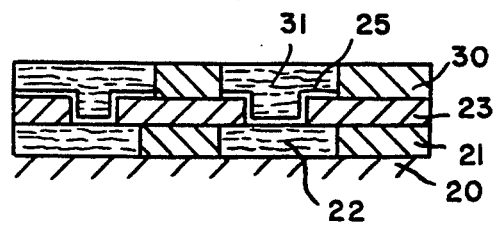

Following removal of catalyzed sacrificial coating 24 (FIGS. 11 and 12), the sacrificial coating is replaced with a permanent dielectric coating 30 having imaged openings defining interconnections and conductor lines as shown in FIG. 14. Permanent dielectric coating 30 has imaged openings that replicate those in original sacrificial coating 24. The next step in the process is shown in FIG. 15 where electroless copper is deposited over the catalyzed surface 25 to form metallized interconnections and conductors 31. In this embodiment of the invention, the multilayer board differs from that formed by the process of Embodiment 3 as can be seen from a comparison of FIGS. 13 and 15 where conductor lines 31 in FIG. 15 are of a rectangular configuration compared to rounded conductor lines 27 shown in FIG. 13. This embodiment of the invention is preferred where close impedance control is required.

EMBODIMENT 5

Activation of Copper on an Underlying Circuit

Figure 16:
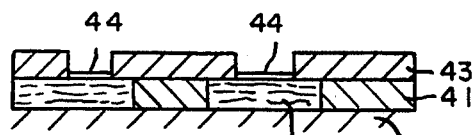
FIGS. 16 to 18 depict the cross section of a multilayer board formed over a first circuit layer during various stages of its fabrication in the Embodiment 5 process of the invention and involves activation of the copper conductors of an underlying circuit for the formation of metallized interconnections.
Figure 17:
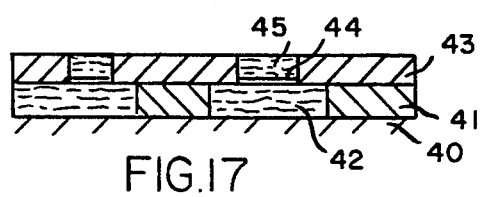
Figure 18:
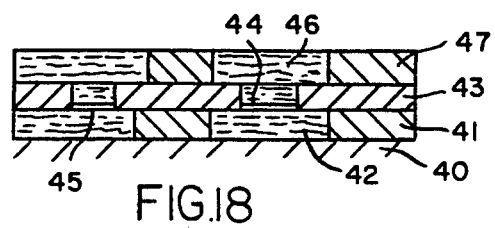

FIGS. 16 to 18 of the drawings illustrate the formation of a multilayer circuit by a process characterized by activation of underlying copper coupled with electroless plating.

The process of Embodiment 5 is illustrated in FIG. 16 of the drawings and involves use of a first circuit layer comprising substrate 40 having dielectric coating 41 and conductors 42. Dielectric coating 43 is applied over the surface comprising dielectric coating 41 and copper conductors 42 and has imaged openings defining an array of interconnections. As in the other embodiments of the invention, imaging can be by laser ablation, exposure through a mask and development, or any other method known to those skilled in the art. With copper conductors 42 exposed or bared by formation of imaged openings in dielectric coating layer 43, the underlying copper can be readily activated to initiate deposition of electroless copper. This is accomplished by contact of the composite with an activator solution such as a non passivating acid or noble metal solution to form activated coating 44 over copper conductors 42.

FIG. 17 of the drawings illustrates the next step in the process where electroless metal has been deposited over the activated coating 44 to form interconnections 45. As shown in FIG. 17, it is desirable that plating continue until interconnections 45 are level with dielectric coating 43 to form a planar surface comprising dielectric coating 43 and interconnections 45.

Following formation of interconnections 45, an additional conductor layer consisting of dielectric coating 47 and conductor lines 46 can be formed by any desired process such as by the use of selective metallization as taught elsewhere herein.

EMBODIMENT 6

Sacrificial Coating with Plating Catalyst Poison in a Negative Mode Process

FIGS. 19 to 22 of the drawings illustrate the formation of a multilayer circuit by a process characterized by the use of a sacrificial coating, a poison for an electroless plating catalyst and a step of electroless metal deposition.

Figure 19:
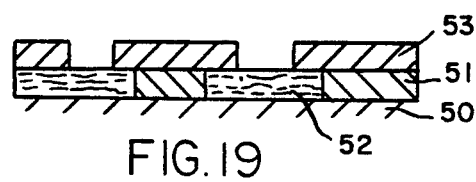
FIGS. 19 to 22 depict the cross section of a multilayer board formed over a first circuit layer during various stages of its fabrication in Embodiment 6 process of the invention and involves use of an electroless plating catalyst poison and a sacrificial coating in a negative mode process.

In FIG. 19, there is shown a first circuit layer comprising substrate 50 having copper conductors 52 separated from each other by dielectric coating 51. Again, the method of making the circuit is not part of the invention. The first step in the process, also shown in FIG. 19, involves application of a dielectric coating 53 over the underlying circuit. Dielectric coating 53 is provided with an array of imaged openings defining interconnections.

Figure 20:
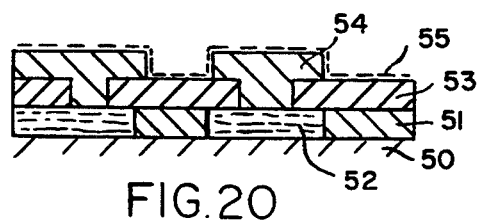

The next step in the process is shown in FIG. 20 and comprises the steps of first applying sacrificial coating layer 54 and providing the sacrificial coating with an array of imaged openings defining a negative pattern of desired conductor lines. By a negative pattern, it is meant that the imaged openings define areas where electroless metal deposition is undesired. Following formation of sacrificial coating 54, those portions of dielectric coating 53 bared by the openings in sacrificial coating 54 are treated with an electroless metal plating catalyst poison to form regions 55 where electroless plating is undesired. Suitable electroless catalyst poisons will be discussed in greater detail below, but generally their use involves treatment with a solution that inhibits adsorption of catalyst during contact with an electroless plating catalyst.

Figure 21:
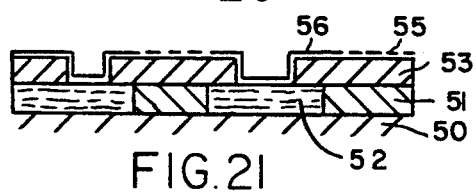

Following formation of catalytically poisoned regions 55, as shown in FIG. 21, sacrificial coating 54 is removed leaving regions coated with catalytic poison 55 with the remaining regions originally protected by sacrificial coating 54 free of a layer of catalytic poison. Thereafter, the composite is immersed in an electroless plating catalyst to form catalytic regions 56 resulting in a continuous layer of regions of catalytic poison 55 and catalyst 56. The result is a composite having portions of its surface comprising catalytically poisoned regions 55 and catalytic regions 56 because catalyst absorbs only on the non poisoned region originally protected by sacrificial coating 54.

Figure 22:
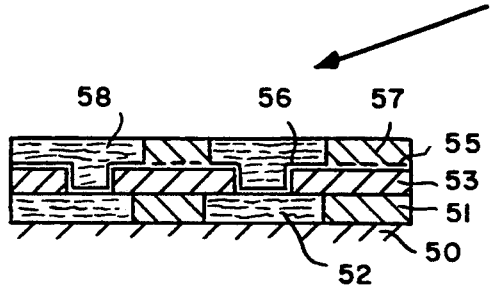
Figure 23:
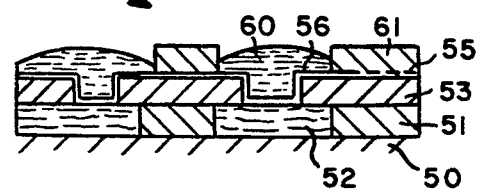
FIG. 23, in conjunction with FIGS. 19 to 21, depict the cross section of a multilayer board formed over a first circuit layer during various stages of its fabrication in the Embodiment 7 process of the invention and involves use of an electroless plating catalyst poison and a sacrificial coating in a negative mode process.

The next steps in the process are shown in FIG. 22. A permanent dielectric coating 57 is applied over the top surface of the composite and provided with imaged openings defining interconnections and conductor lines. Preferably, dielectric coating 57 is coincident with poisoned regions 55. Thereafter, electroless copper is plated over catalytic regions 56 to form interconnections and conductor lines 58.

Following formation of the circuit as shown, additional circuit layers can be formed by the process depicted in FIGS. 19 to 22 or other embodiments of the invention as described herein.

EMBODIMENT 7

Sacrificial Coating with Plating Catalyst Poison in a Negative Mode Process—Alternative Process For this embodiment of the invention, the procedure described in connection with FIGS. 19 to 21 (Embodiment 6) is repeated. Continuing from FIG. 21, the next step in the process is shown in FIG. 22. In this embodiment, electroless copper is deposited over catalytic surface 56. Deposition will not occur over those regions 55 coated with catalytic poison. Where the deposition is not contained by dielectric coating, the conductor lines will have a rounded configuration. Following the deposition of the electroless copper to form conductor lines and interconnects 60, the conductors are optionally encapsulated using permanent dielectric coating 61.

EMBODIMENT 8

Use of Dielectric Having a Filling of a Catalyst Precursor

FIGS. 24 to 27 of the drawings illustrate the formation of a multilayer circuit by a process characterized by the use of a dielectric material having a catalytic precursor over at least its top surface or homogeneously distributed throughout the dielectric layer.

Figure 24:
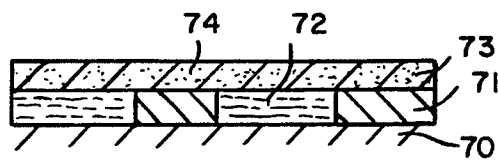
FIGS. 24 to 27 depict the cross section of a multilayer board formed over a first circuit layer during various stages of its fabrication in the Embodiment 8 process of the invention and involves use of a dielectric material having a catalyst precursor dispersed through out at least the surface of the dielectric.
Figure 25:
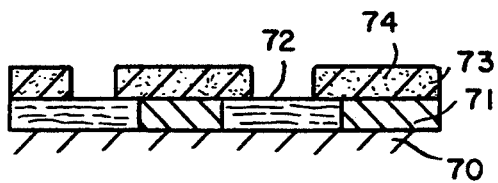
Figure 26:
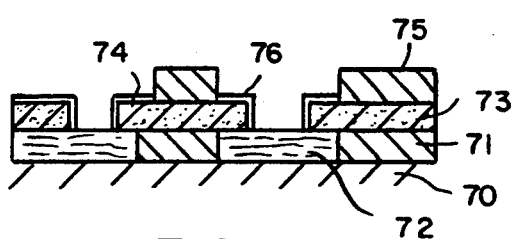

The process of Embodiment 8 starts with a printed circuit layer as shown in FIG. 24. The circuit comprises substrate 70, dielectric material 71 and copper conductors 72. As illustrated in FIG. 25, a dielectric coating 73 in an image pattern of interconnections is coated onto the composite of FIG. 24. Dielectric coating 73 is filled with a catalyst precursor material 74. Cuprous oxide is a suitable catalyst precursor material as will be described in greater detail below but other fillers known to the art are suitable. Preferably the filler is a non conductor. Catalyst precursor material 74 is preferably distributed throughout dielectric coating 73 as shown, or may be applied as a surface coating over dielectric coating 73 (not shown).

Following application of dielectric coating 73 filled with catalyst precursor 74, the dielectric coating is provided with imaged openings that comprise an array of interconnections. The next step in the process, shown in FIG. 26, comprises application of permanent dielectric coating 75 having imaged openings defining recesses for conductor lines. Following the application of coating 75, the exposed surfaces of dielectric coating 73 containing dispersed catalyst precursor 74 is activated to provide a catalytic layer 76. The activation step may involve a combination of process steps such as a first treatment step with an etchant, such as a permanganate or chromic acid solution, to expose the catalytic precursor 74 dispersed throughout dielectric coating 73, followed by activation of the catalyst precursor to render the same catalytic to electroless metal deposition such as by contact with a solution of a reducing agent if the catalyst precursor is cuprous oxide. The reducing agent reduces the cuprous oxide to a form believed to be copper catalytic to electroless metal deposition.

Figure 27:
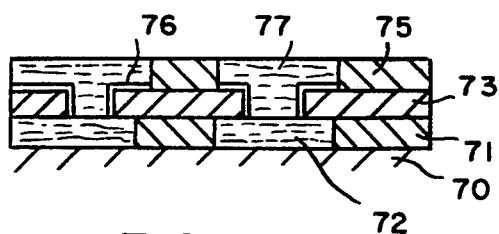

Following formation of catalytic layer 76, electroless copper is deposited over catalytic layer 76 to form conductor lines and interconnection 77 as shown in FIG. 27. Dielectric coating 73 between conductor lines 77 does not increase the conductivity between conductor lines because the catalytic precursor was not made conductive by activation as it was masked by dielectric layer 75 at the time the precursor was activated.

Figure 28:
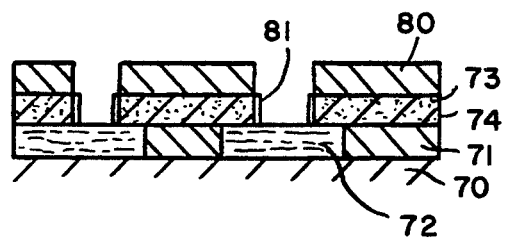
FIGS. 28 to 30, in conjunction with FIGS. 24 and 25, depict the cross section of a multilayer board formed over a first circuit layer during various stages of its fabrication in the Embodiment 9 process of the invention and involves the use of a dielectric having a catalyst precursor dispersed through out at least the surface of the dielectric and a sacrificial coating.
Figure 29:
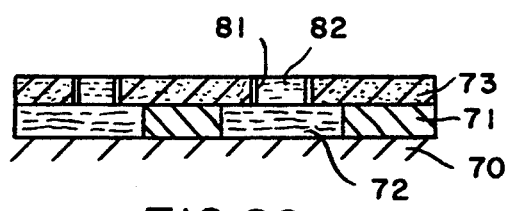
Figure 30:
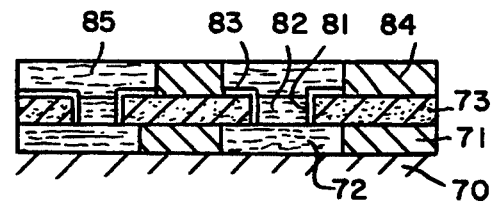

EMBODIMENT 9
Use of a Dielectric Coating Having a Filling of a Catalyst Precursor in Combination with a Sacrificial Coating A process illustrating Embodiment 9 of the invention is shown in FIGS. 28 through 30 of the drawings in conjunction with FIGS. 24 and 25.

As in Embodiment 8, FIG. 24 represents a composite comprising a substrate 70 and a circuit comprising dielectric coating 71 and copper conductors 72. The composite is coated with dielectric coating 73 having catalytic precursor 74 distributed therethrough. As shown in FIG. 25, imaged openings are provided in dielectric coating 73 in an array of interconnections.

The next step in the process is depicted in FIG. 28. In this step, a sacrificial coating layer 80 is disposed over dielectric coating 73. The sacrificial coating layer 80 is free of catalyst precursor and is provided with imaged openings corresponding to the array of interconnections in dielectric coating 73. Following application of sacrificial coating 80 over the composite, the composite is treated to activate the catalyst precursor 74 is dielectric layer 73 resulting in activation of the precursor only on the sidewalls of dielectric 73 to form catalytic surface 81. The process of activation is as described above for Embodiment 8.

The next step in the process involves electroless metal plating of the imaged openings having catalytic surface 81. Activation of copper conductors 71 where bared in the imaged openings of layer 73 may precede plating. As shown in FIG. 29, sacrificial coating 80 is preferably removed prior to plating to provide enhanced mass transport of the plating solution in the imaged openings. In a lesser preferred embodiment, the step may follow metallization. Metallization results in the formation of metallized interconnections 82.

The final steps in the process are shown in FIG. 30 and comprise formation of a circuit layer over the surface comprising dielectric coating 73 and interconnections 82. In the embodiment shown, a permanent dielectric coating 84 is provided having imaged openings defining a conductor pattern. The dielectric coating 73 containing catalytic precursor 74 is activated to form catalytic regions 83. Electroless copper is then deposited within the imaged openings to form conductor lines 85.

EMBODIMENT 10
Use of a Dielectric Coating Filled With Catalytic Precursor in Combination with Laser Ablation FIGS. 31 to 34 of the drawings depict the cross section of a multilayer board formed over a first circuit layer during various stages of its fabrication using a dielectric coating having a catalyst precursor dispersed throughout at least the surface of a dielectric coating coupled with two laser ablation steps.

Figure 31:
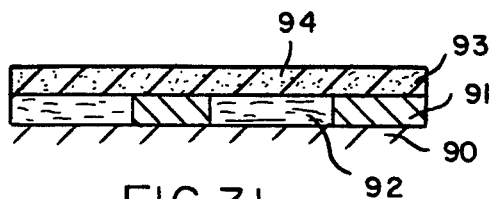
FIGS. 31 to 34 depict the cross section of a multilayer board formed over a first circuit layer during various stages of its fabrication in the Embodiment 10 process of the invention and involves the use of a dielectric having a catalyst precursor dispersed through out at least the surface of the dielectric and a two laser ablation steps.

In FIG. 31, there is shown a first circuit comprising substrate 90 coated with dielectric coating material 91 and conductors 92. The first step of the process involves applying dielectric coating 94 containing catalyst precursor 93 over the surface of dielectric coating 91 and conductors 92. Catalyst precursor is distributed on the surface of dielectric coating layer 93 (not shown) or throughout the coating as illustrated in the drawing. For this embodiment of the invention, the coating 93 should be relatively thick, i.e., at least one mil and preferably 2 mils thick. It may be necessary to apply several coatings to obtain a coating of this thickness.

Figure 35:
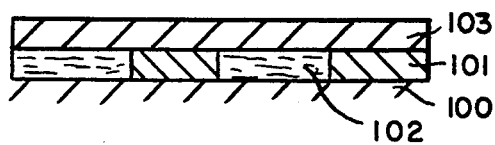
FIGS. 35 to 38 depict the cross section of a multilayer board formed over a first circuit layer during various stages of its fabrication in the Embodiment 11 process of the invention and involves the use of a permanent dielectric using a process that involves a double imaging step.
Figure 32:
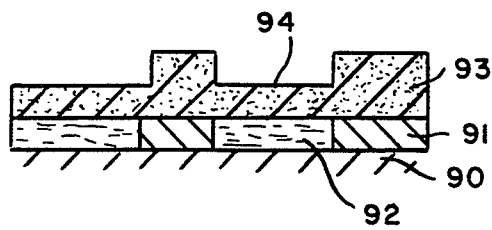

Following formation of coating 94, as shown in FIG. 32, imaged openings in a pattern of desired conductor lines are formed in coating 93. The imaged openings may be formed by exposure and development but in this embodiment of the invention, they are preferably formed by laser ablation. The step of forming imaged openings may require several imaging steps such as laser ablation of imaged openings in an array of conductor lines and thereafter, a second laser ablation step to form openings for interconnections. Following formation of the imaged openings, the surfaces of the imaged openings are activated by methods disclosed above whereby catalyst precursor 94 on the surfaces of the imaged openings are converted to a catalytic coating 95. As shown in FIG. 35, the second circuit layer and interconnections are completed by deposition of electroless copper 96 into the imaged openings over catalytic coating 95.

EMBODIMENT 11
Use of a Permanent Dielectric Coating and a Double Imaging Step Embodiment 11 of the invention is depicted in FIGS. 35 through 38 of the drawings. In FIG. 35, there is shown a printed circuit board substrate comprising dielectric material 101 with copper conductors 102 over substrate 100. The circuit board substrate is coated with permanent dielectric coating 103. In this embodiment of the invention, as in Embodiment 10, the permanent dielectric coating 103 is relatively thick, preferably 2 mls. Again, it may be necessary to use multiple coatings to obtain full thickness for this coating.

Figure 36:
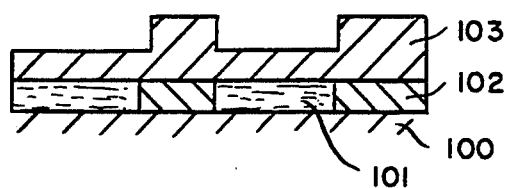
Figure 33:
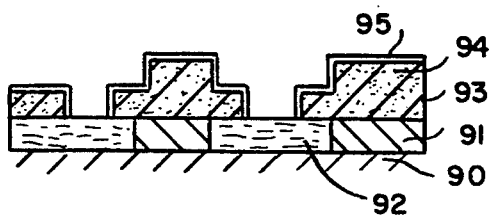
Figure 37:
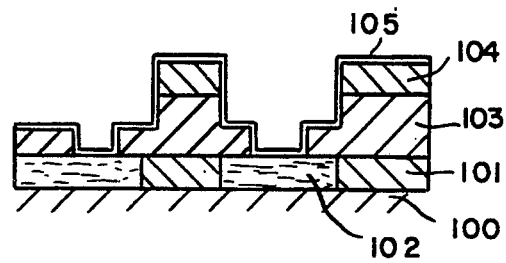
Figure 34:
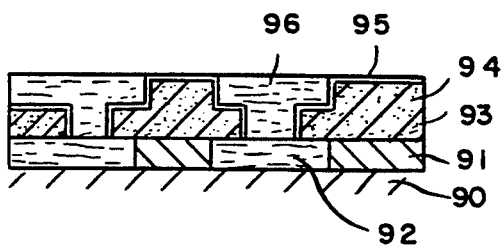

The first procedural step in the process is depicted in FIG. 36 where, using surface imaging techniques, the surface of dielectric coating 102 is imaged in an image pattern of desired conductors and developed to yield imaged openings defining conductors. Thereafter, as shown in FIG. 37, the dielectric coating 103 is imaged for a second time and developed to provide imaged openings in an array of interconnections. Still with reference to FIG. 37, sacrificial coating 104 is displaced over permanent dielectric coating 103 and the entire composite is catalyzed with an electroless plating catalyst to form catalytic layer 105. Following catalysis, sacrificial coating 104 is removed together with those regions of catalytic coating 105 directly over sacrificial coating 104.

Figure 38:
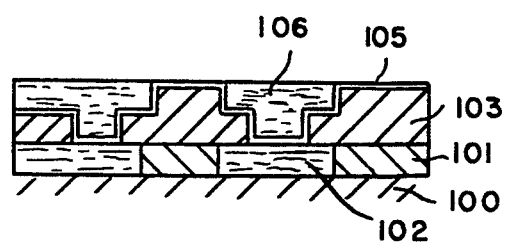

The result of removal of sacrificial coating 104 is a composite having imaged openings with their surfaces catalyzed in a patter of interconnections and conductor lines. As shown in FIG. 38, electroless metal is then deposited over the catalyzed surfaces to form metallized conductors and interconnections 106.

It should be obvious to those skilled in the art that various steps from the embodiments described above can be interchanged so that modifications to the processes described above would be obvious to those skilled in the art. Moreover, the procedures described above illustrate major steps in the process contemplated by the invention. Many of the procedural steps known in the art have been omitted. For example, it is known that when using organic coating materials such as the dielectric and sacrificial coatings contemplated herein, baking for drying and curing are recommended and art recognized procedures. Likewise, to adhere one organic coating to another, it is often necessary to pretreat the coating to enhance adhesion. In catalysis processes, it is conventional to treat the catalyst with an accelerator prior to plating. To prepare copper for subsequent deposition or for adhesion of an organic coating material to it, it is often necessary to clean and activate the copper. These are all steps known to the art and not described in detail herein.

In many of the above processes, since photoimagable dielectric coatings are used to form imaged openings into which metal deposits, conductors and interconnections conform to the shape of the channel or opening. Hence, plated conductors and interconnections will have a cross section conforming to the shape of the imaged opening, typically square or rectangular for conductors and circular for interconnections. Moreover, imaged openings formed by exposure and development of photoactive dielectric materials may be of any desired shape or size. In this respect, the invention permits formation of interconnections that could not be achieved with prior art processes.

In accordance with the invention, openings for interconnections between layers are imaged—not drilled. Therefore, it is possible to form a multilayer board without drilling. In this respect, all vias can be formed by imaging and selective deposition or by laser imaging, though it may be desirable to drill holes from the exterior of the stack to its interior.

The materials used to practice processes described above are defined in greater detail below.

The Dielectric Coating—The dielectric coatings used in the processes of the invention should have a dielectric constant so as to adequately insulate conductors from each other. In this respect, a dielectric constant of not greater than 4.5 is preferred and a dielectric constant not exceeding 3.5 is more preferred. Numerous organic coating materials are suitable for this purpose. Preferred materials include polyamines and polyimides.

When a dielectric material that is photoactive is used, it should be capable of yielding images of satisfactory resolution. The necessary resolution is dependent upon the requirements of the multilayer board. Preferably, the resolution should be sufficient to provide line widths not exceeding 10 mils, preferably not exceeding 5 mils, and most preferably, not exceeding 2 mils. Interconnections desirably do not exceed 5 mils and preferably are of a diameter less than the line width of the signal lines.

The selected photoactive dielectric coating material is desirably resistant to attack by an electroless plating solution over periods of prolonged exposure. Electroless copper plating solutions are usually strongly alkaline. Therefore, the dielectric should be resistant to attack by alkaline solutions. Materials suitable for this purpose are disclosed in U.S. Pat. Nos. 4,839,261; 4,830,953; and 4,820,549, all incorporated herein by reference. The dielectric coating composition is applied by any art recognized method. Once applied, it is imaged by exposure to actinic radiation of suitable wavelength and developed or it is ablated by laser imaging.

The Plating Chemicals—Selective metallization in accordance with the invention utilizes an electroless plating catalyst. Known plating catalysts typically comprise tin-palladium colloids where the colloids adsorb from suspension onto the surface of a substrate as a thin layer of discrete particles. Such catalysts are disclosed in U.S. Pat. Nos. 3,011,920 and 4,762,560, incorporated herein by reference. Other catalysts known to the art may also be used such as those formed from copper. Catalysis occurs by immersing a substrate in the catalyst solution for a time sufficient for the catalyst to adsorb onto the surface. Typically, from one to ten minutes is adequate.

The plating solution is typically an electroless copper plating solution as is known to the art. Such solutions are well known in the art and typically comprise a source of cupric ions, a complexing agent to hold the ions in solution, a reducing agent to reduce the cupric ions to metallic copper in the presence of the catalyst—e.g., formaldehyde and a pH adjustor. Typical copper plating solutions are disclosed in U.S. Pat. Nos. 4,834,796; 4,814,009; 4,684,550; and 4,548,644, all incorporated herein by reference. A preferred plating solution is one capable of plating ductile copper able to withstand a solder shock test of about 260° C. for 10 seconds without cracking. Plating is continued until desired deposit thickness is achieved.

The Sacrificial Coating—The sacrificial coating is one that is not a permanent coating and therefore does not require the dielectric capability of the dielectric coating. The requirements of the sacrificial coating include good image resolution, an ability to easily develop and remove and an ability to withstand plating chemicals. A preferred class of such materials is disclosed in U.S. Pat. Nos. 4,439,517 and 4,592,816 incorporated herein by reference. A preferred material is described in Example 1 of the latter patent.

Copper Activator—When copper is to be directly plated, it is necessary to activate the copper prior to electroless metal deposition. The reason for this is that copper is not generally autocatalytic to electroless deposition. Activation can be accomplished in several ways. For example, mild etching with an acid solution such as a hydrochloric acid solution may be used to activate the copper. Alternatively, activation may be accomplished by contact with a weak solution of a noble metal salt, preferably, a one percent solution of palladium chloride in hydrochloric acid.

Catalytic Poison—Selective metallization is possible using a combination of a sacrificial coating and a catalytic poison. Suitable catalytic poisons together with means for use of the same are disclosed in U.S. Pat. No. 4,749,449 incorporated herein by reference.

Filled Dielectric Material—Organic coating materials filled with a catalyst precursor are known in the art. A typical catalyst precursor comprises cuprous oxide. The cuprous oxide is dispersed in a coating composition such as a polyimide or polyamide. The coating composition is coated onto a substrate and metallized by disrupting the surface of the coating to expose the cuprous oxide. The cuprous oxide is then treated with a reducing agent to reduce the cuprous oxide to metallic copper. The metallic copper then functions as a catalytic material for metal deposition. A coating composition containing the catalyst precursor with cuprous oxide dispersed therethrough together with a method of metallization employing the same is disclosed in U.S. Pat. Nos. 4,565,606; 4,517,227; 4,756,756; 4,564,424; all incorporated herein by reference.

Though the invention has been described using the example set forth above, it should be understood that the invention is useful for many other methods for the manufacture of multilayer boards.

I claim:

1. A method for the formation of a circuit board having two or more layers of circuitry, said method comprising the steps of applying a permanent dielectric coating over a first circuit layer having imaged openings defining interconnections, catalyzing the surface of the permanent dielectric coating and the imaged openings by contact with an electroless plating catalyst, applying a coating over said catalyzed permanent dielectric coating, said coating having imaged openings defining a circuit pattern, and electrolessly plating metal into said openings for interconnections and circuitry whereby, when plated, there is formed a second circuit in electrical contact with said first circuit.

2. The method of claim 1 where the electroless plating catalyst is a colloidal metal catalyst applied to a particulate free surface.

3. The method of claim 2 where the imaged openings are formed by exposure through a mask and wet development.

4. The method of claim 2 where the imaged openings are formed by laser ablation.

5. The method of claim 2 where the colloidal metal catalyst is a palladium catalyst.

6. The method of claim 2 where the permanent dielectric coating has a dielectric constant that does not exceed 4.5.

7. The method of claim 6 where the dielectric constant does not exceed 3.5.

8. The method of claim 2 where the deposited metal is copper.

9. The method of claim 2 where the permanent dielectric is a member selected from the group of epoxies and polyamines.

* * * * *